US008421469B2

(12) United States Patent
Hermann et al.

(10) Patent No.: US 8,421,469 B2
(45) Date of Patent: Apr. 16, 2013

(54) METHOD AND APPARATUS FOR ELECTRICALLY CYCLING A BATTERY CELL TO SIMULATE AN INTERNAL SHORT

(75) Inventors: Weston Arthur Hermann, Palo Alto, CA (US); Nicholas Paul Manov, Palo Alto, CA (US); Paul Karplus, Moraga, CA (US); Alex Prilutsky, San Mateo, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 427 days.

(21) Appl. No.: 12/910,661

(22) Filed: Oct. 22, 2010

(65) Prior Publication Data

US 2012/0013341 A1    Jan. 19, 2012

Related U.S. Application Data

(60) Provisional application No. 61/364,838, filed on Jul. 16, 2010.

(51) Int. Cl.
*G01N 27/416* (2006.01)
*G01R 31/00* (2006.01)

(52) U.S. Cl.
USPC ............................. 324/434; 324/426; 324/500

(58) Field of Classification Search ............... 324/434, 324/426, 500
See application file for complete search history.

(56) References Cited

U.S. PATENT DOCUMENTS

| | | | |
|---|---|---|---|
| 4,801,869 A * | 1/1989 | Sprogis ................... | 714/733 |
| 6,727,021 B1 * | 4/2004 | Shiota et al. ............. | 429/232 |
| 7,061,253 B2 * | 6/2006 | Coffeen et al. ........... | 324/551 |
| 7,336,081 B2 * | 2/2008 | Kasamatsu et al. ....... | 324/426 |
| 7,395,252 B2 * | 7/2008 | Anderson et al. ......... | 706/45 |
| 7,425,833 B2 * | 9/2008 | Bertness et al. .......... | 324/426 |
| 8,049,509 B2 * | 11/2011 | Sakurai et al. ............ | 324/426 |
| 2004/0117169 A1 * | 6/2004 | Acar et al. ............... | 703/15 |

* cited by examiner

*Primary Examiner* — M'Baye Diao
(74) *Attorney, Agent, or Firm* — Patent Law Officer of David G. Beck

(57) ABSTRACT

A test apparatus and corresponding method for simulating an internal cell short and initiating thermal runaway in a battery cell is disclosed whereby the cell is internally heated through rapid charge and discharge cycles at high currents. The magnitude of the selected current may be modulated to simulate a cell short with the desired power profile without unrealistically heating neighboring cells or interfering with the thermal environment of the cell within the module.

23 Claims, 5 Drawing Sheets

METHOD AND APPARATUS FOR ELECTRICALLY CYCLING A BATTERY CELL TO SIMULATE AN INTERNAL SHORT

CROSS-REFERENCE TO RELATED APPLICATION

This application claims benefit of the filing date of U.S. Provisional Patent Application Ser. No. 61/364,838, filed Jul. 16, 2010, the disclosure of which is incorporated herein by reference for any and all purposes.

FIELD OF THE INVENTION

The present invention relates generally to batteries and, more particularly, to a test method for simulating an internal short within a battery.

BACKGROUND OF THE INVENTION

High energy density batteries may develop an internal short circuit spontaneously or in response to overheating or any of a variety of different abusive conditions (e.g., manufacturing flaws, improper handling or storage, misuse, improper charging, etc.). This internal short leads to the release of energy, in the form of heat, within the cell. If the magnitude of the short is sufficiently large, the temperature of the cell may continue to increase until material decomposition and thermal runaway occurs. If the shorted cell undergoing thermal runaway is mounted within a battery pack, the large amount of thermal energy rapidly released during a thermal runaway event may cause other cells in proximity to the affected cell to enter into thermal runaway, leading to a cascading effect. As a result, power from the battery pack is interrupted and the system employing the battery pack is likely to incur extensive collateral damage due to the scale of the thermal runaway event and the associated release of thermal energy.

Although unlikely, the possibility that a cell within a battery pack may go into thermal runaway due to a spontaneous internal short has led to the need to test battery packs used in safety sensitive applications in order to determine their response characteristics to such an event. Battery pack testing is especially important given the recent surge in demand for electric vehicles, and thus large battery assemblies. Unfortunately, to date such testing has been hampered by the inability to intentionally induce a localized internal short without the test methodology itself compromising the accuracy of the results.

Utilizing conventional test equipment, inducement of a localized internal short is typically accomplished by either conductive overheating or cell overcharging. Conductive overheating requires that a heating coil or other resistive, high temperature rated heating element be located in close proximity to the cell, for example by wrapping the cell with the heating element. The heat is then transferred to the cell through thermal conduction. The advantage of this approach is that the tester is able to select the desired heating profile to be applied to the cell. Additionally, the state-of-charge and runaway character of the cell is preserved using this testing approach. Unfortunately this testing methodology dramatically alters the thermal environment of the cells within the battery pack by introducing extra thermal mass into the pack and, in some instances, requiring pack modification in order to accommodate the necessary heating elements. Also, as it is difficult to apply the heat only to the desired cell, adjacent cells may be excessively heated before the initiated thermal runaway event occurs, thereby further altering the thermal environment of the test pack.

The other approach often used to simulate a spontaneous internal cell short is by overcharging the cell in question. While this approach preserves the thermal environment surrounding the cells, unfortunately it changes the character of the thermal runaway reaction. In general, the reaction caused by overcharging is more energetic than would typically occur during an internal cell short. Furthermore, while a spontaneous internal short may develop with a variety of constant or profiled magnitudes, it is difficult to simulate internal shorts of various magnitudes by overcharging a single cell.

As prior art methods of testing a cell for thermal runaway unrealistically alter the character of the event or introduce extra mass or localized hot spots outside the cell that may not be representative of the operational thermal environment of the battery cell or module, what is needed is a method for inducing thermal runaway in a battery cell with minimal impact on the character of the event or the thermal environment of the surrounding cells. The present invention provides such a method.

SUMMARY OF THE INVENTION

The present invention provides a test apparatus and corresponding method for simulating an internal cell short and initiating thermal runaway in a battery cell by internally heating it through rapid charge and discharge cycles at high currents. The magnitude of the selected current may be modulated to simulate a cell short with the desired power profile. The disclosed system and method maintains the character of the event without unrealistically heating neighboring cells or interfering with the thermal environment of the cell within the module.

In one aspect of the invention, a battery pack short simulation testing system is provided that includes a plurality of cells, at least one of which is a test cell; a pair of test leads electrically connected to the test cell; a power supply electrically connected to the test cell via the test leads and not electrically connected to the non-test cells of the battery pack; and a power supply controller configured to cycle the power supply at a preset frequency (e.g., 0.1-100 Hz, more preferably 0.5-50 Hz, and still more preferably 1-10 Hz) and supplying power to the test cell at a preset current level (e.g., 1-100 C, more preferably 3-50 C, and still more preferably 10-30 C). The non-test cells may be electrically interconnected. Preferably the power supply controller is programmable, more preferably the power supply controller is programmable and configured to follow a predefined test procedure and/or a preset test cell heating profile. The testing system may include one or more temperature sensors so that the power supply controller may be programmed to modify the power level sent to the cell in response to a preset test cell heating profile and the monitored cell temperature. The test cell may be modified to bypass an integrated current interrupt device and/or an integrated positive temperature coefficient current limiting element and/or other cell safety mechanisms that reduce current in response to high current or high cell temperatures.

In another aspect of the invention, a method of simulating a short within at least one test cell of a plurality of cells is provided, the method comprised of the steps of (i) breaking any electrical connection between the test cell and the non-test cells of the plurality of cells; (ii) electrically coupling a power supply to the test cell; and (iii) cycling the power supply at a preset frequency, wherein the power supply provides power to the test cell at a preset current. The cycling step may further comprise the step of programming a power supply controller to cycle the power supply at the preset frequency and preset current. The cycling step may further comprise the step of programming a power supply controller to modify at least one of the preset frequency and preset current in accordance with a preset test cell heating profile. The method may further comprise the step of monitoring the current temperature corresponding to the test cell, wherein the cycling step may further comprise the step of programming a power supply controller to modify at least one of the preset frequency and preset current in response to a preset test cell heating profile and the current temperature. The method may further comprise the step of calculating the amount of heat released by the test cell as a function of time, wherein the cycling step may further comprise the step of programming a power supply controller to modify at least one of the preset frequency and preset current in response to a preset test cell heating profile and the result of the calculating step. The method may further comprise the step of bypassing an integrated current interrupt device and/or an integrated positive temperature coefficient current limiting element.

A further understanding of the nature and advantages of the present invention may be realized by reference to the remaining portions of the specification and the drawings.

DESCRIPTION OF THE SPECIFIC EMBODIMENTS

In the following text, the terms "battery", "cell", and "battery cell" may be used interchangeably and may refer to any of a variety of different cell chemistries and configurations including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other battery type/configuration. The terms "battery pack" and "battery module" may be used interchangeably and as used herein refer to multiple individual batteries contained within a single piece or multi-piece housing, the individual batteries electrically interconnected to achieve the desired voltage and capacity for a particular application. It should be understood that identical element symbols used on multiple figures refer to the same component, or components of equal functionality. Additionally, the accompanying figures are only meant to illustrate, not limit, the scope of the invention and should not be considered to be to scale. Accordingly, not all battery elements and/or battery pack elements are shown in the illustrations.

In contrast to the prior art approaches described above, the present test methodology allows the simulation of a spontaneous internal cell short following an arbitrary magnitude profile without unrealistically affecting the thermal environment of the neighboring cells. As a result, the response characteristics of a battery pack in which one of the cells within the pack develops an internal short may be accurately obtained.

Figure 1:
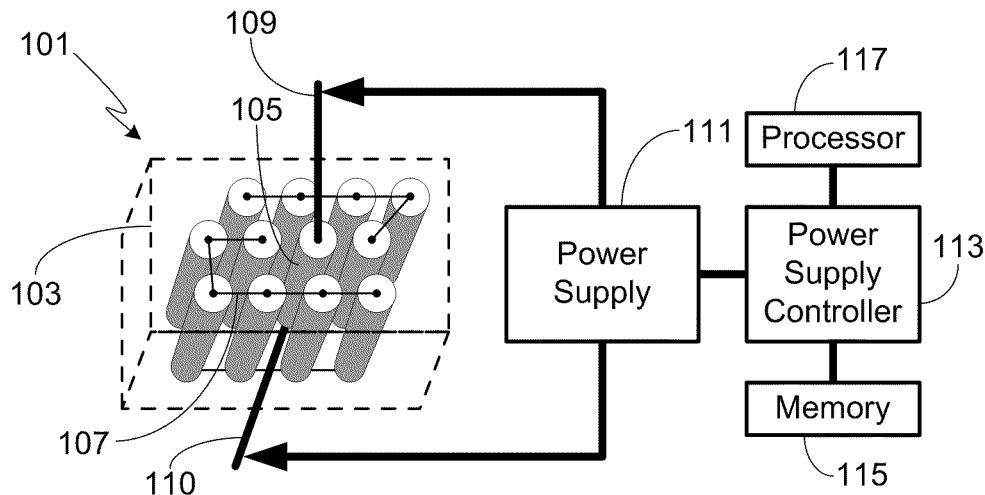
FIG. 1 illustrates a system for simulating a cell short in accordance with the invention.

FIG. 1 illustrates the basic test system in accordance with the invention. The test system is designed to be used with a battery pack 101, regardless of the number or configuration or layout of cells contained within the battery pack, and regardless of the configuration/design of the battery pack or module housing 103 (shown in phantom). Although the illustrated test system indicates cylindrical cells (e.g., utilizing an 18650 form factor), as previously noted the current invention is not limited to a specific cell type or design. Cell 105 in which the internal short is to be simulated may be located in the middle of the pack as shown, or anywhere else in the pack, such as near or on the edge of the pack. As a result, a particular battery pack configuration may be characterized for a variety of different thermal runaway situations, i.e., where the shorted cell is located in various locations throughout the pack.

Except for the cell in which a short is to be simulated (i.e., cell 105), the cell interconnects (e.g., interconnects 107) that are used to electrically couple the cells together, directly or via a collector plate or other means, may either be removed or left in place during testing. Preferably these interconnects as well as any other battery pack hardware (e.g., collector plates, cooling systems, insulating members, battery pack enclosure members, etc.) are left in place during testing, thus insuring that the thermal environment seen during testing remains representative of the actual thermal environment, thereby allowing an accurate battery pack characterization to be obtained.

The interconnects for the cell to be tested, i.e., cell 105, are removed prior to testing and replaced with a pair of test leads 109/110. Test leads 109/110 are of sufficiently low resistance to handle the intended current without heating up and potentially influencing the temperature of the surrounding cells or structure. For example, in one test configuration test leads 109/110 each had a resistance of 0.2 milli-Ohm/centimeter. While any suitable test lead may be used, in at least one embodiment test leads 109/110 are flat and relatively flexible, thus simplifying battery pack assembly. Exemplary test leads were fabricated with a copper core, which was then coated with stainless steel and over coated with nickel. Preferably test leads 109/110 are coated with an electrically insulating material, e.g., an adhesive-backed polyamide material, thus helping to prevent inadvertent shorting. The electrical insulating outer coating may be replaced with a thermally insulating material, or the selected electrically insulating outer coating may also have thermally insulating properties, thus further insuring that the thermal environment of the battery pack is not affected by the test system.

Cell test leads 109/110 are connected to a power supply 111. Power supply 111 is either programmable, or controlled by a separate, programmable power supply controller 113. During testing, cell 105 is electrically cycled such that the time integral of the charge portion of each cycle is equivalent to the time integral of the discharge portion of the cycle. As a result of this approach, the state-of-charge (SOC) of the cell is not significantly altered regardless of the shape of the waveform. Therefore while the waveform produced by power supply 111 may be a sine wave, square wave, or other symmetrical waveform, it may also be comprised of a non-symmetrical waveform, for example one in which the charging portion of the cycle is long and shallow while the discharging portion of the cycle is short and deep. It will be appreciated that the flexibility offered by this approach further enhances the ability of the invention to simulate a variety of internal short conditions.

In a preferred embodiment, the cycle frequency is in the range of 0.1 to 100 Hz, more preferably in the range of 0.5 to 50 Hz, and still more preferably in the range of 1 to 10 Hz. The current supplied to cell 105 by power supply 111 is sufficient to cause significant heating in the cell, but not so high as to cause fusing of electrical conductors (e.g., internal electrode assembly) within the cell. In a preferred embodiment, the current supplied by power supply 111 to cell 105 has a C-rate in the range of 1-100 C, more preferably in the range of 3-50 C, and still more preferably in the range of 10-30 C. The temperature rise of the cell is a function of the current supplied by power supply 111, as well as the internal impedance and heat capacity of the cell. For example, an 18650 form factor lithium ion cell with an internal impedance of 60 milli-Ohm and a heat capacity of 40 J/K cycled at 30 amps will rise in temperature at a rate of 1.35° C. per second in an adiabatic environment.

By cycling cell 105 using the described methodology, the cell is uniformly heated throughout, thereby simulating an internal cell short in which the power is small enough to allow the cell to thermally equilibrate. Simulating a high power internal short in which the cell does not have time to thermally equilibrate, and therefore will more rapidly enter into thermal runaway, requires operating the test at higher power levels. In some instances it may be necessary to model the differences between localized heating and uniform heating, thus allowing the test methodology to accurately simulate an internal short of the desired characteristics.

The heating rate applied to cell 105 can be held constant or follow a predefined profile, thus allowing the system of the invention to simulate a variety of different shorting conditions (i.e., arising from an improper and abusive charging profile; arising from a massive internal short such as that which might be expected during a vehicle collision; arising from a worsening internal short due to a foreign particle within the electrode windings, etc.). It will be appreciated that since the impedance of test cell 105 will change as a function of temperature, a constant charge/discharge current will cause a reduction of heating rate as a function of temperature. Accordingly, and in order to obtain the desired heating profile, preferably the test system of the invention follows the methodology described below.

Figure 2:
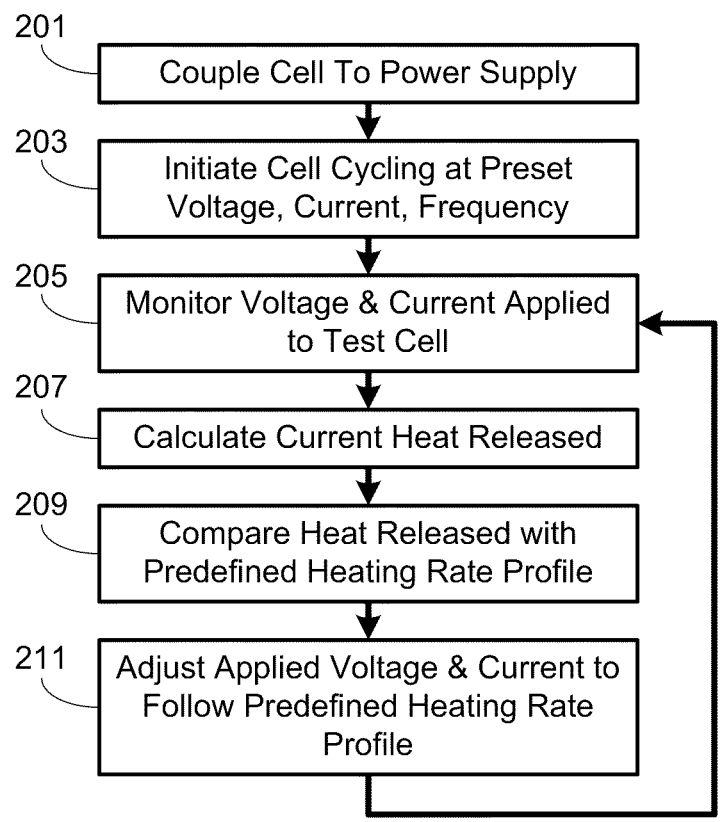
FIG. 2 illustrates a preferred test procedure.

FIG. 2 illustrates a preferred test procedure in accordance with the invention. Initially the cell to undergo short simulation (e.g., cell 105) is coupled to the external power supply (e.g., supply 111). (Step 201). Once the battery pack is ready for testing, the external power supply begins cycling the test cell in accordance with a predefined set of test parameters, typically recorded in memory 115 (step 203). It will be appreciated that memory 115 may be internal to controller 113, or an external memory coupled to controller 113, and may be comprised of EPROM, EEPROM, flash memory, RAM, a solid state disk drive, a hard disk drive, or any other memory type or combination of memory types. Once cell cycling begins, the voltage and current applied to the cell is monitored (step 205). As the heat released within the cell is the absolute value of the loaded voltage minus the open circuit voltage, which should not change if the SOC does not change, multiplied by the instantaneous current, these monitored test parameters may be used to calculate the heat being released as a function of test time (step 207). The heat produced during test cell cycling is then compared to the desired heating rate profile that has been predefined by the test operator (step 209). The current or loaded voltage applied to the test cell is then adjusted to insure that the heating rate exhibited by the test cell follows the predefined test profile (step 211). This process of monitoring testing conditions and adjusting them to insure that the heat released by the test cell follows the predefined heating rate profile is continually repeated, at a preset frequency, until the test concludes. Preferably this process is automated, for example by using a control algorithm to adjust the current in order to follow the predefined heating rate profile. Typically, although not always, test conclusion is defined by the cell undergoing cycling entering into thermal runaway.

Figure 3:
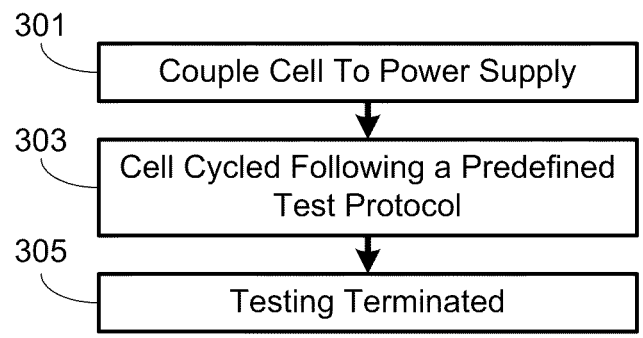
FIG. 3 illustrates an alternate test procedure in which testing is performed in accordance with a predefined test protocol.

FIG. 3 illustrates a minor variation of the test methodology. In this procedure after the test cell, e.g., cell 105, is coupled to the power supply, e.g., supply 111, (step 301), testing begins in which the power supplied to the test cell follows a predefined testing profile (step 303). In contrast to the previously described procedure, during this process the desired test profile for the entire test is predefined and preferably recorded into memory 115. Prerecording the test profile allows the test to be easily automated, assuming that controller 113 includes, or is coupled to, a processor 117 that is capable of automatically performing the test and following the predefined test procedure. The predefined test procedure specifies the cycle frequency as well as the power (voltage and current) to be applied to the test cell as a function of time. Following a predefined test profile is especially useful when multiple battery packs must undergo identical test procedures, for example as a step in a quality control process. Testing concludes (step 305) when the predefined test profile is completed, or when the cell is no longer capable of being cycled (i.e., when the cell undergoes thermal runaway).

Figure 4:
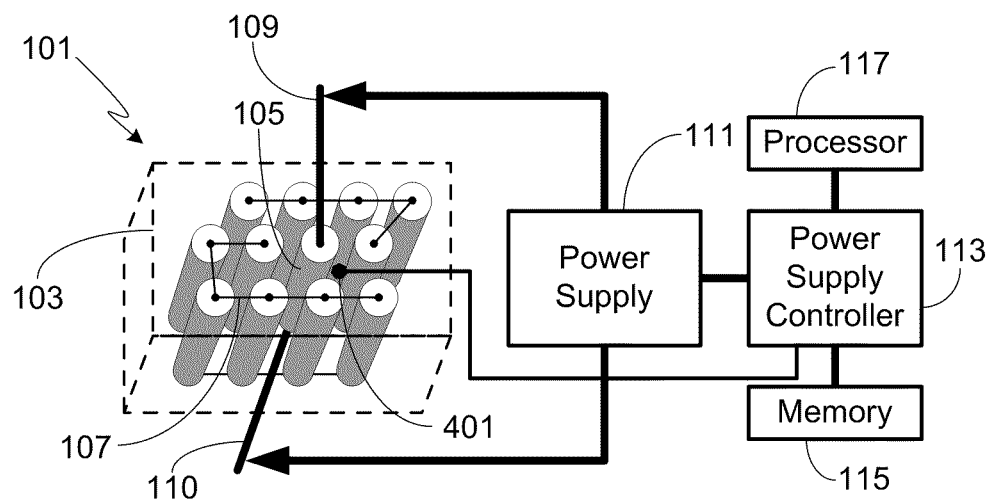
FIG. 4 illustrates a modification of the system shown in FIG. 1 in which one or more temperature sensors monitor the temperature of the cells under test.
Figure 5:
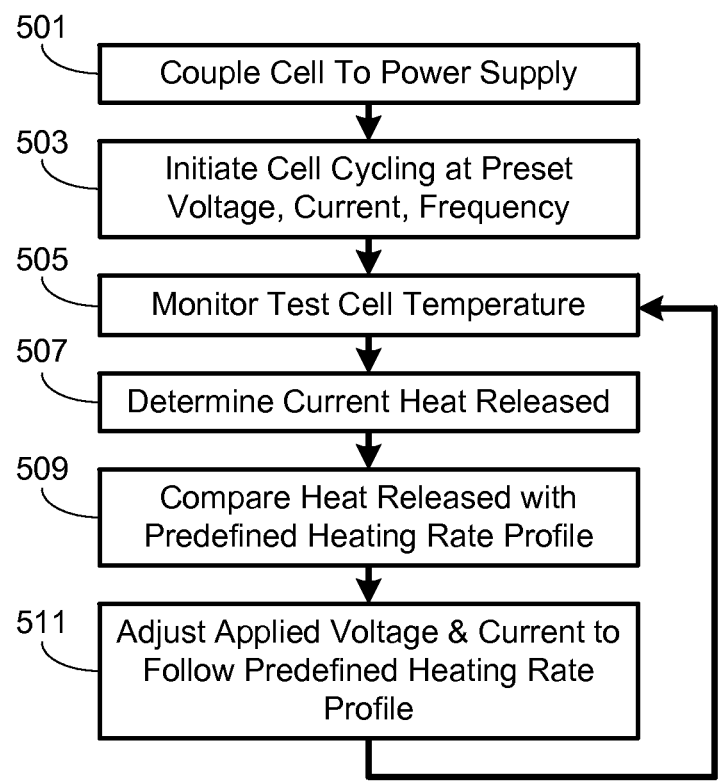
FIG. 5 illustrates an alternate test procedure using the data collected from the temperature sensor(s) shown in FIG. 4.

FIGS. 4 and 5 illustrate a minor modification of the system and process described above. As shown in FIG. 4, one or more temperature sensors 401 are included within battery pack 101, sensors 401 providing temperature data on the test cell. If multiple temperature sensors 401 are employed (not shown), their output may either be averaged to compensate for minor test variations, or the output from each sensor may be calibrated based on proximity to the test cell (e.g., cell 105). The output from sensor(s) 401 is coupled to power supply controller 113, and thus processor 117 as well. During testing, after the cell has been coupled to the power supply (step 501) and cell cycling has been initiated (step 503), the temperature of the test cell is monitored (step 505). By monitoring cell temperature, the heat released by the test cell may be determined as a function of time (step 507). The heat produced during test cell cycling is then compared to the desired heating rate profile that has been predefined by the test operator (step 509). The voltage and current applied to the test cell is then adjusted, as necessary, so that the heat released by the test cell closely approximates the predefined test profile (step 511). This process of monitoring cell temperature and adjusting power supply conditions to insure that the heat released by the test cell follows the predefined heating rate profile is continually repeated, at a preset frequency, until the test concludes. As noted above, test termination may be at a predefined time, or when the cell is no longer capable of being cycled, for example due to the cell undergoing thermal runaway.

Figure 6:
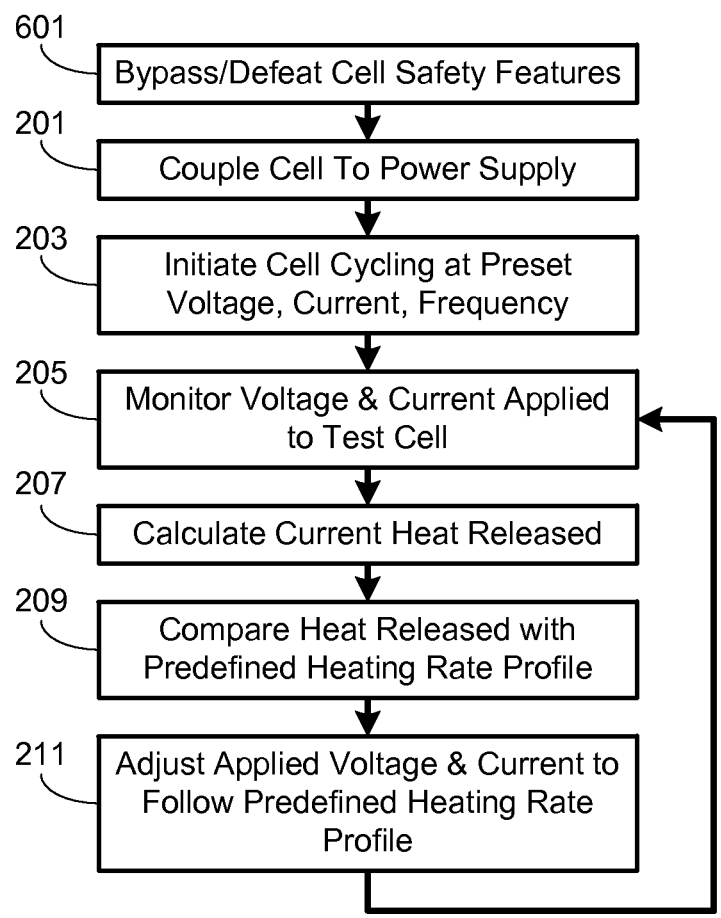
FIG. 6 illustrates an alternate test procedure in which cell safety features are bypassed/defeated prior to short simulation and battery pack testing.

While the above system and disclosed testing methodologies may be used to simulate an internal cell short, it will be appreciated that the design of some cells may include one or more built-in safety features that are preferably bypassed or defeated in order to allow power supply 111 to cycle the test cell at a high current. If this is the case for the test cell of interest, then the selected test methodology must be modified to include a step for bypassing and/or defeating the cell's safety features. Clearly if the cell to be tested is to be installed into a battery pack or module, the safety features should be bypassed and/or defeated prior to installing the cell into the pack/module. For example, FIG. 6 illustrates the procedure outlined above relative to FIG. 2, but modified to include a step 601 in which the cell's safety features are bypassed/defeated. It will be appreciated that this same step may be added to any of the previously described procedures.

A conventional cell will now be described so that further detail may be provided regarding the methods of bypassing or otherwise defeating the cell's safety features. It should be understood that the described cell, i.e., cell 700, as well as the particulars of the employed safety features are only meant to illustrate such features, and are not intended to provide a detailed description of every type of safety feature that may be employed within a cell. The disclosed safety features in cell 700 are simply illustrative of the type and variety of the techniques and devices that may be used to protect a cell from a high current or other destructive condition.

Figure 7:
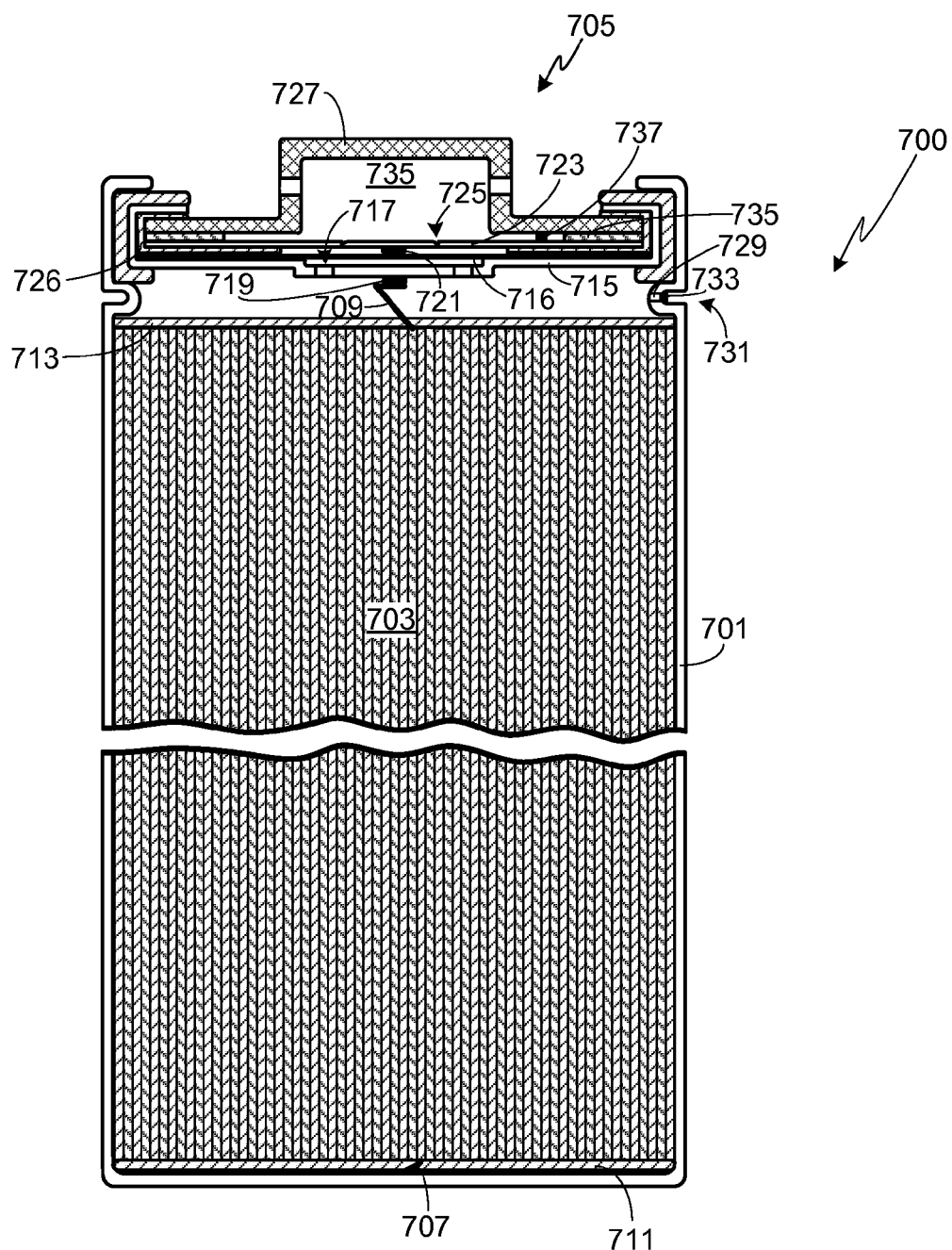
FIG. 7 illustrates various cell safety features as well as some methods of bypassing such features.

FIG. 7 is a cross-sectional view of a conventional cell and cap assembly commonly used with lithium ion batteries employing the 18650 form-factor. Battery 700 includes a cylindrical case 701, an electrode assembly 703, and a cap assembly 705. Electrode assembly 703 is comprised of an anode sheet, a cathode sheet and an interposed separator, wound together in a spiral pattern often referred to as a jelly-roll'. An anode electrode tab 707 connects the anode electrode of the wound electrode assembly to the negative terminal which, for an 18650 cell, is case 701. A cathode tab 709 connects the cathode electrode of the wound electrode assembly to the positive terminal via cap assembly 705. Typically battery 700 also includes a pair of insulators 711/713 located on either end of electrode assembly 703 to avoid short circuits between assembly 703 and case 701.

The cap assembly 705 of cell 700 houses several different safety mechanisms. In particular, tab 709 is connected to assembly 705 via a current interrupt device (CID). The purpose of the CID is to break the electrical connection between the electrode assembly and the positive terminal if the pressure within the cell exceeds a predetermined level. Typically such a state of over pressure is indicative of the cell temperature increasing beyond the intended operating range of the cell, for example due to an extremely high external temperature or due to a failure within the battery or charging system. Although other CID configurations are known, in the illustrated cell the CID is comprised of a lower member 715 and an upper member 716. Members 715 and 716 are electrically connected, for example via crimping along their periphery. Lower member 715 includes multiple openings 717, thus insuring that any pressure changes within case 701 are immediately transmitted to upper CID member 716. The central region of upper CID member 716 is scored (not visible in FIG. 7) so that when the pressure within the cell exceeds the predetermined level, the scored portion of member 716 breaks free, thereby disrupting the continuity between the electrode assembly 703 and the battery terminal.

Under normal pressure conditions, lower CID member 715 is coupled by a weld 719 to electrode tab 709 and upper CID member 716 is coupled by a weld 721 to safety vent 723. In addition to disrupting the electrical connection to the electrode assembly during an over pressure event, the CID in conjunction with safety vent 723 are designed to allow the gas to escape the cell in a somewhat controlled manner. Safety vent 723 may include scoring 725 to promote the vent rupturing in the event of over pressure. The periphery of CID members 715/716 are electrically isolated from the periphery of safety vent 723 by an insulating gasket 725. As a consequence, the only electrical connection between CID members 715/716 and safety vent 723 is through weld 721.

During short simulation, the increasing cell temperature is likely to cause the CID and the corresponding vent 723 to trigger due to the increase in internal cell pressure, thereby disrupting the test by breaking the continuity between the electrode assembly 703 and terminal 727. To insure that cell short simulation is allowed to continue for as long as desired, preferably the CID of the cell is defeated so that electrical continuity to the electrode assembly is maintained. The CID may be electrically bypassed, for example by forming an alternate electrical path, or defeated, for example by providing an alternate escape path for the increasing gas pressure. An alternate escape path for the gas pressure may be created by perforating the cell casing 701 in one or more locations 729. It will be appreciated that perforation 729, located in crimp region 731, is only meant to illustrate one method of defeating a CID. Clearly other methods may be employed, as well as other locations for pressure bypass perforations. Assuming the use of a bypass perforation, care must be taken to minimize water ingress or electrolyte egress before the test. Accordingly, in at least one preferred embodiment a temporary blockage covers the perforation(s), the plug preferably being formed of tape or a non-structural adhesive that is chemically compatible with the electrolyte, the plug being designed to fail before the CID and the vent, thereby allowing the release of internal gas pressure. A representative plug 733 is shown in FIG. 7.

Another safety device that is often included on a battery is a positive temperature coefficient (PTC) current limiting element. In cell 700, PTC 735 couples safety vent 723 to battery terminal 727. PTC 735 is designed to exhibit a very high impedance when the current density exceeds a predetermined level, thereby limiting short circuit current flow. Accordingly, the PTC may interfere with the present test system's ability to cycle the cell at a high current level. To bypass the PTC element, in some instances the cap portion of the cell can be removed, thereby allowing a direct connection to be made to vent plate 723. In other cell designs, a conductive material (e.g., aluminum foil) can be placed between the cap terminal 727 and the vent plate 723, thus electrically bypassing PTC 735. Conductor 737 represents one form of a PTC bypass element.

As previously noted, the electrode assembly 703 is comprised of an anode, a cathode, and a separator located between the two electrodes. During a non-simulated internal short, i.e., during actual use, when an internal short occurs it is typically localized to a specific region of the electrode assembly. In some instances, such a localized internal short may be powerful enough to immediately send the cell into thermal runaway. Alternately, if the short power is low enough relative to the internal thermal conductivity of the cell, heat spreads throughout the cell and the cell slowly heats up until the temperature-dependent internal heat release rate in addition to the short power begins to accelerate and the cell reaches thermal runaway. To help prevent thermal runaway in such a situation, the separator in a conventional cell is often designed to effectively shut down in response to high temperature, thereby stopping the discharge of the cell through the internal short. Typically separator shutdown is accomplished by having the pores within the separator swell shut when the temperature exceeds a predetermined threshold value. Preferably the threshold temperature is low enough, e.g., on the order of 120° C., to effectively shut down the separator before self-heating significantly accelerates (e.g., (>150° C.). Additionally, given the elevated cell temperature, the CID preferably operates to electrically isolate the cell. The intended result of these safety mechanisms is to cause the affected cell to slowly discharge without reaching thermal runaway conditions. Accordingly, it will be appreciated that simulating an internal short with a magnitude low enough to heat the rest of the cell to a temperature capable of triggering separator shutdown is not exceedingly important.

The system of the present invention causes relatively uniform heating throughout the cell, rather than the localized heating that will typically result from an internal short. Therefore separator shutdown is not likely to occur. Additionally, due to the ability to program controller 113 to follow a prescribed power profile as previously discussed, separator shutdown may be effectively bypassed. During testing, and as the impedance of the separator rises, the voltage continues to rise until there is breakdown within the cell. Breakdown may occur locally instead of distributed throughout the cell thereby causing intense localized heating, which may lead immediately to runaway. For the reasons noted above, this should be acceptable for simulating all likely short scenarios that also include separator shutdown behavior.

As will be understood by those familiar with the art, the present invention may be embodied in other specific forms without departing from the spirit or essential characteristics thereof. For example, while it is preferred that the short simulation test be applied to a single cell within the battery pack under test, the invention is equally applicable to testing battery packs in which a short is simulated within multiple cells of the pack. If multiple cells are tested within a single pack, the test cells may either be tested at the same time or in a predefined time sequence. Accordingly, the disclosures and descriptions herein are intended to be illustrative, but not limiting, of the scope of the invention which is set forth in the following claims.

What is claimed is:

1. A battery pack short simulation testing system, comprising:
   a plurality of cells, wherein at least one of said plurality of cells is preselected as a test cell, wherein said plurality of cells correspond to said test cell and at least one non-test cell, and wherein said test cell is not electrically connected to said non-test cells;
   a pair of test leads electrically connected to a pair of terminals corresponding to said test cell;
   a power supply electrically connected to said test cell via said pair of test leads, wherein said power supply is not electrically connected to said non-test cells; and
   a power supply controller coupled to said power supply, wherein said power supply controller is configured to cycle said power supply at a preset frequency and to supply said test cell with a preset current level.

2. The battery pack short simulation testing system of claim 1, wherein said non-test cells are electrically interconnected, and wherein said test cell is not electrically interconnected with said non-test cells.

3. The battery pack short simulation testing system of claim 1, wherein said preset frequency is in the range of 0.1 to 100 Hz.

4. The battery pack short simulation testing system of claim 1, wherein said preset frequency is in the range of 0.5 to 50 Hz.

5. The battery pack short simulation testing system of claim 1, wherein said preset frequency is in the range of 1 to 10 Hz.

6. The battery pack short simulation testing system of claim 1, wherein said preset current level has a C-rate in the range of 1 to 100 C.

7. The battery pack short simulation testing system of claim 1, wherein said preset current level is in the range of 3 to 50 C.

8. The battery pack short simulation testing system of claim 1, wherein said preset current level is in the range of 10 to 30 C.

9. The battery pack short simulation testing system of claim 1, wherein said power supply controller is programmable, and wherein said power supply controller is programmed to modify said preset current level as a function of time.

10. The battery pack short simulation testing system of claim 1, wherein said power supply controller is programmable, and wherein said power supply controller is programmed to follow a predefined test procedure in which said preset current level is modified in accordance with said predefined test procedure and as a function of time.

11. The battery pack short simulation testing system of claim 1, wherein said power supply controller is programmable, and wherein said power supply controller is programmed to follow a preset test cell heating profile.

12. The battery pack short simulation testing system of claim 1, further comprising at least one temperature sensor mounted within said battery pack and monitoring a temperature corresponding to said test cell, wherein a signal corresponding to said monitored temperature is transmitted to said power supply controller, wherein said power supply controller is programmable, wherein said power supply controller is programmed to follow a preset test cell heating profile, and wherein said power supply controller modifies a power level sent to said test cell in response to said preset test cell heating profile and said monitored temperature.

13. The battery pack short simulation testing system of claim 1, wherein prior to testing said test cell is modified to bypass a current interrupt device integrated within said test cell.

14. The battery pack short simulation testing system of claim 1, wherein said test cell includes at least one cell perforation prior to testing, wherein said at least one cell perforation allows internal cell pressure variations to bypass a current interrupt device integrated within said test cell.

15. The battery pack short simulation testing system of claim 1, wherein prior to testing said test cell is modified to bypass a positive temperature coefficient current limiting element integrated within said test cell.

16. A method of simulating a short within at least one test cell of a plurality of cells, wherein said plurality of cells correspond to said at least one test cell and at least one non-test cell, said method comprising the steps of:
   breaking any electrical connection between said at least one test cell and said at least one non-test cell;
   electrically coupling a power supply to said at least one test cell; and
   cycling said power supply at a preset frequency, wherein said power supply provides power to said at least one test cell at a preset current to simulate said short.

17. The method of claim 16, wherein said cycling step further comprises the step of programming a power supply controller to cycle said power supply at said preset frequency and said preset current.

18. The method of claim 17, wherein said programming step further comprises the step of programming said power supply controller to modify at least one of said preset frequency and said preset current in accordance with a preset test cell heating profile.

19. The method of claim 16, further comprising the step of monitoring a current temperature corresponding to said at least one test cell, wherein said cycling step further comprises the step of programming a power supply controller to modify at least one of said preset frequency and said preset current in response to a preset test cell heating profile and said current temperature.

20. The method of claim 16, further comprising the step of calculating an amount of heat released from said at least one test cell as a function of time, wherein said cycling step further comprises the step of programming a power supply controller to modify at least one of said preset frequency and said preset current in response to a preset test cell heating profile and a result from said calculating step.

21. The method of claim 16, further comprising the step of monitoring instantaneous current, and wherein said result of said calculating step is based on said instantaneous current.

22. The method of claim 16, further comprising the step of bypassing a current interrupt device integrated within said at least one test cell, wherein said bypassing step is performed prior to said step of cycling said power supply.

23. The method of claim 16, further comprising the step of bypassing a positive temperature coefficient current limiting element integrated within said at least one test cell, wherein said bypassing step is performed prior to said step of cycling said power supply.

* * * * *